United States Patent [19]
Kawai et al.

[11] Patent Number: 5,547,613
[45] Date of Patent: Aug. 20, 1996

[54] MAGNETO-OPTICAL ELEMENT MATERIAL FORMED OF MAGNETIC GARNET SINGLE CRYSTALS

[75] Inventors: Hirotaka Kawai, Hamamatsu; Shinzo Fujii; Hiromitsu Umezawa, both of Toyohashi, all of Japan

[73] Assignee: FDK Corporation, Tokyo, Japan

[21] Appl. No.: 498,226

[22] Filed: Jul. 5, 1995

[30] Foreign Application Priority Data

Jul. 5, 1994 [JP] Japan .................................. 6-176020

[51] Int. Cl.$^6$ .......................... G02B 5/20; C30B 29/28; C01F 17/00
[52] U.S. Cl. .......................... 252/584; 117/945; 423/263
[58] Field of Search .......................... 117/945; 252/584; 423/263

[56] References Cited

U.S. PATENT DOCUMENTS

| | | | |
|---|---|---|---|
| 4,379,853 | 4/1983 | Mateika et al. | 423/263 |
| 5,186,866 | 2/1993 | Ryno et al. | 423/594 |

FOREIGN PATENT DOCUMENTS

| | | | |
|---|---|---|---|
| 62-216310 | 9/1987 | Japan | 117/945 |
| 1-246520 | 2/1989 | Japan | |
| 1-250924 | 5/1989 | Japan | |
| 3-069597 | 3/1991 | Japan | 117/945 |
| 4-338200 | 11/1992 | Japan | 117/945 |
| 5-117095 | 5/1993 | Japan | 117/945 |

OTHER PUBLICATIONS

Chem, Abstract CA 122:172889, 1994, No Month.

Y. Yokoyama et al., "Reducing Treatment Effects On The Optical Absorption Loss of Ca-Doped Bi-Substituted Iron Garmet Films", Journal Society of Japan of Applied Magnetism, vol. 10, No. 2, pp. 165, (1986), No Month.

T. Tamaki et al., "Magneto-Optical Properties Of $(RBi)_3Fe_5O_{12}$ at 0.8 μm Wavelength Band", Journal of Japan Society of Applied Magnetism, vol. 12, No. 2, p. 179 (1988), No Month.

D. L. Wood & J. P. Remeika, "Effect Of Impurities On The Optical Properties Of Yttrium Iron Garnet", J. Appl. Phys. 38, 1038 (1967), No Month.

"Identifications of Atomic Structures of $Gd_3Sc_2GA_3O_{12}$," (Russian language reference), 1988, No Month, Kondratyuk et al., Kristallografiya, 33(1), pp. 51–56.

*Primary Examiner*—Steven Bos
*Attorney, Agent, or Firm*—Wenderoth, Lind & Ponack

[57] ABSTRACT

A material made of magnetic garnet single crystals has excellent characteristics particularly in a wavelength band of from 950 to 1070 nm, which is usable for a wavelength 980 nm for pumping light of erbium doped fiber amplifier, and for a wavelength of 1017 nm for pumping light of an praseodymium doped fiber amplifier. One example of the material is made of magnetic garnet single crystals expressed by a composition formula of $Nd_{3-x}Bi_xFe_5O_{12}$ ($0.5 \leq x \leq 1.9$), the single crystals being formed by liquid-phase epitaxial growth on a non-magnetic garnet substrate having a lattice constant $<a>$ specified in the range of 12.61 Å $\leq a \leq$ 12.63 Å. The material is suitably used for a magneto-optical element having a wavelength band from 950 to 1070 nm. The non-magnetic garnet substrate can be made of a material having a composition expressed by $Gd_{3-y}Nd_ySc_2Ga_3O_{12}$ ($1.0 \leq y \leq 1.4$).

2 Claims, 2 Drawing Sheets

MAGNETO-OPTICAL ELEMENT MATERIAL FORMED OF MAGNETIC GARNET SINGLE CRYSTALS

BACKGROUND OF THE INVENTION

1. Field of the Invention

The present invention relates to a material made of magnetic garnet single crystals formed by liquid-phase epitaxial growth (hereinafter referred to as "LPE"), and particularly to a material for magneto-optical elements which is made of magnetic garnet single crystals having a composition of $(NdBi)_3Fe_5O_{12}$.

2. Description of the Related Art

A material made of magnetic garnet single crystals, which has a Faraday effect, is used as an essential material for an optical isolator. At present, the optical communication systems wavelength bands centered at 1310 nm and 1550 nm. In recent years, as a material made of magnetic garnet single crystals used in these wavelength bands, a single crystal film (LPE film) formed on a non-magnetic garnet single crystal substrate by an LPE process has been mainly used. The reason for this is that the LPE process is excellent in terms of mass-production. A typical substrate, used in the above LPE process, is made of $(CaGd)_3(ZrMgGa)_5O_{12}$ having a lattice constant $<a>$ of 12.496 Å.

Characteristics of a material made of magnetic garnet single crystals are evaluated on the basis of a performance index F (deg/dB) expressed by a relationship of $F = \theta_F / \alpha$, where $\theta_F$ indicates a Faraday rotation coefficient (deg/cm) and $\alpha$ indicates an absorption coefficient (dB/cm). The performance of a material made of magnetic garnet single crystals is proportional to the performance index F. The performance index F is increased with an increase in the Faraday rotation coefficient $\theta F$ and with a decrease in the absorption coefficient $\alpha$. In this regard, methods for increasing the Faraday rotation coefficient $\theta F$ have been proposed, for example in Japanese Patent Laid-Open Publication Nos. 1-246520/1989 and 1-250924/1989, wherein the substitution ratio of Bi in a material made of magnetic garnet single crystals is increased. Moreover, methods of decreasing the absorption coefficient $\alpha$ by addition of a bivalent or quadrivalent compound or by oxidation and reduction after growth of the crystals have been proposed (Journal of Japan Society of Applied Magnetism, Vol. 10, No. 2, 1986).

Incidentally, in recent years, an optical fiber amplifier capable of amplifying an optical signal as it is, has been actively developed. A praseodymium doped fiber amplifier is used in a communication wavelength band centered at 1310 nm, and an erbium doped fiber amplifier is used in a communication wavelength band centered at 1550 nm. However, so as to practically use each of these amplifiers, an optical isolator for a pumping light source for a stable pumping operation is required. The wavelength of pumping light of the praseodymium doped fiber amplifier is 1017 nm, while the wavelengths of pumping light of the erbium doped fiber amplifier are 980 nm and 1480 nm. Accordingly, an optical isolator usable in each of wavelength bands centered at 980 nm, 1017 nm and 1480 nm is required, and to meet this requirement, a material made of magnetic garnet single crystals suitable for each wavelength band must be developed.

At present, the existing material made of magnetic garnet single crystals for a wavelength band centered at 1550 nm is diverted to a material for a wavelength band centered at 1480 nm, with no problem. On the contrary, the existing material made of magnetic garnet single crystals for a wavelength band centered at 1310 nm cannot be substantially diverted to a material for wavelength bands centered at 980 nm and 1017 nm because it has large optical absorption and thereby the characteristics thereof are deteriorated. The reason why the optical absorption is thus increased is that the absorption of $Fe^{3+}$ having a peak near 900 nm is extended to about 1000 nm.

SUMMARY OF THE INVENTION

An object of the present invention is to provide a material for a magneto-optical element which is made of magnetic garnet single crystals formed by an LPE process and having excellent characteristics particularly in a wavelength band of from 950 to 1070 nm.

According to one embodiment of the present invention, there is provided a material for a magneto-optical element which is made of magnetic garnet single crystals expressed by a composition formula of $Nd_{3-x}Bi_xFe_5O_{12}$ ($0.5 \leq x \leq 1.9$), the single crystals being formed by liquid-phase epitaxial growth on a non-magnetic garnet substrate having a lattice constant $<a>$ specified in the range of 12.61 Å $\leq a \leq$ 12.63 Å. The material is suitably used for a magneto-optical element for a wavelength band of from 950 to 1070 nm. The non-magnetic garnet substrate can be made of a material having a composition formula expressed by $Gd_{3-y}Nd_ySc_2Ga_3O_{12}$ ($1.0 \leq y \leq 1.4$).

As described above, in the case where iron garnet is used for a Faraday rotator of an optical isolator for wavelength bands centered at 980 nm and 1017 nm, there arises a problem in that the absorption is large because the absorption of $Fe^{3+}$ has a peak near 900 nm. In a material made of magnetic garnet single crystals formed by a flux method, however, the peak of the absorption is shifted onto a shorter wavelength side by increasing the lattice constant of the crystal. In view of the foregoing, the present inventors have developed a non-magnetic garnet single crystal substrate having a lattice constant $<a>$ specified in the range of 12.61 Å $\leq a \leq$ 12.63 Å which is relatively larger than that of the conventional one, and attempted to grow a magnetic garnet single crystal film having a composition of $(NdBi)_3Fe_5O_{12}$ on this substrate by the LPE process, thus accomplishing the present invention.

The reason why neodymium (Nd) is used in the present invention is that Nd generates the same negative Faraday rotation as that of Bismuth (Bi) and can increase the Faraday rotation coefficient $\theta_F$. In addition, Nd exhibits the absorption in a wavelength band centered at 1500 nm, and thereby it is unsuitable as a material constituting a Faraday rotator for a wavelength band centered at 1550 nm; however, it can be used without such an inconvenience on the shorter wavelength side from the above wavelength band (particularly, in a wavelength band intended by the present invention). The reason why the substitution ratio $<x>$ of Bi is specified to be $0.5 \leq x \leq 1.9$ is as follows: namely, when the ratio $<x>$ is less than 0.5, the Faraday rotation coefficient $\theta_F$ is small and thereby the film thickness of 45° rotation necessary for an optical isolator is made thicker, and particularly, the absorption on the shorter wavelength side is increased; while when it is more than 1.9, the grown magnetic garnet single crystal film tends to be cracked.

A material made of magnetic garnet single crystals having a composition of $(NdBi)_3Fe_5O_{12}$ has a lattice constant $<a>$ of 12.62 Å. In the case where crystals are grown by the LPE process, there is a limitation in that the lattice constants of a substrate and an LPE film must be matched to each other. A non-magnetic garnet substrate expressed by a composition formula of $Gd_{3-y}Nd_ySc_2Ga_3O_{12}$ ($1.0 \leq y \leq 1.4$) has a lattice constant <a> specified in the range of 12.61 Å $\leq$ a $\leq$ 12.63 Å, and thereby it is most suitably used for film formation of the above magnetic garnet single crystals by the LPE process.

As described above, the material made of the magnetic garnet single crystals having a composition expressed by $(NdBi)_3Fe_5O_{12}$ has a large lattice constant <a> of 12.62 Å, and consequently, like a material made of magnetic garnet single crystals formed by the flux method, it generates a phenomenon in which the peak of absorption near 900 nm is shifted onto the shorter wavelength side, to reduce the absorption in a wavelength band of from 950 nm to 1070 nm, thereby enhancing the performance index. Moreover, as a result of examination by X-ray diffraction, it is revealed that in this material made of the magnetic garnet single crystals, even when the substitution ratio between Nd and Bi is changed, the lattice constant <a> is kept constant (a=12.62 Å), so that single crystal materials having various compositions of different substitution ratios between Nd and Bi can be formed using the same non-magnetic garnet substrate, and the strict control of temperature can be eliminated upon film formation.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

Figure 1:
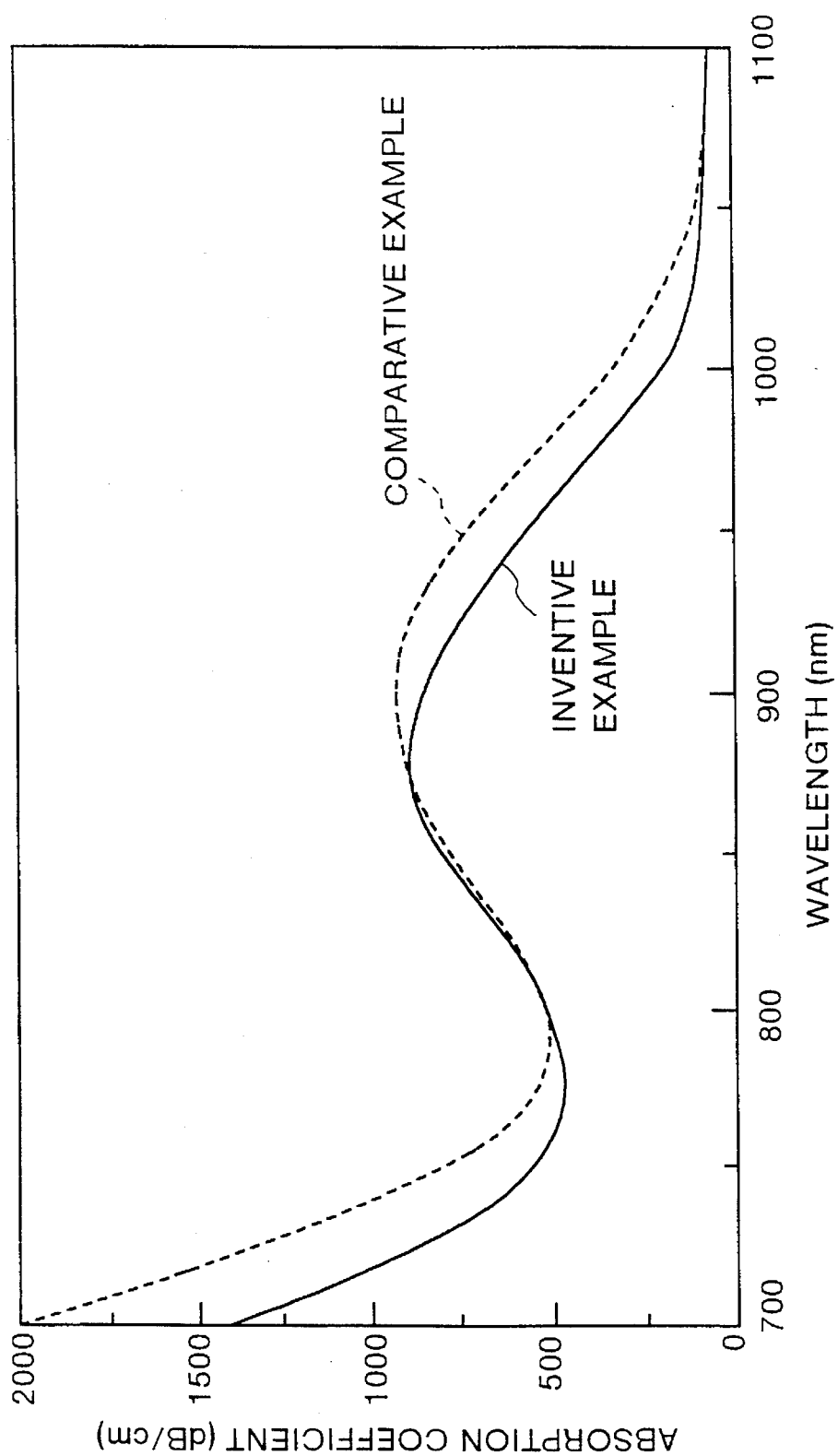
FIG. 1 is a graph showing the absorption spectrum of an Inventive Example and a Comparative Example.

DESCRIPTION OF PREFERRED EMBODIMENTS AND BEST MODE FOR CARRYING OUT THE INVENTION

Non-magnetic garnet single crystals were grown along an orientation <111> using the Czochralski method, thus preparing a substrate. The composition was $Gd_{1.8}Nd_{1.2}Sc_2Ga_3O_{12}$, and the lattice constant <a> was 12.62 Å. On this single crystal substrate, magnetic garnet single crystals having a composition of $(NdBi)_3Fe_5O_{12}$ were grown by the LPE process.

As raw materials of the LPE film, $Nd_2O_3$, $Fe_2O_3$, $Bi_2O_3$, PbO, $B_2O_3$ were used. Each material was melted for 10 hours at 950° C., and was agitated for 3 hours at 950° C. After that, the temperature was dropped to a corresponding single crystal growth temperature of the material. In such a state, magnetic garnet single crystals of the material were grown by the LPE process. One example of the experimental results is shown in Table 1. In Table 1, the term "film thickness" is indicated by that upon actual film formation; and the "cracking" is indicated by the presence or absence of the generation of cracking. Moreover, with respect to the term "characteristics", "Good" and "NG" respectively denote whether or not the film is usable at wavelengths of 980 nm and 1017 nm, which is based on the results shown in Tables 2 and 3. The lattice constants <a> of the materials made of magnetic garnet single crystals in Experimental examples 1 to 6 were constant (12.62 Å) irrespective of the substitution ratio between Nd and Bi.

TABLE 1

| | Composition | growth temperature | film thickness | cracking | characteristics |
|---|---|---|---|---|---|
| Experimental Example 1 | $Nd_3Fe_5O_{12}$ | 900° C. | 210 µm | absence | NG |
| Experimental Example 2 | $Nd_{2.5}Bi_{0.5}Fe_5O_{12}$ | 830° C. | 160 µm | absence | Good |
| Experimental Example 3 | $Nd_{2.0}Bi_{1.0}Fe_5O_{12}$ | 760° C. | 130 µm | absence | Good |
| Experimental Example 4 | $Nd_{1.7}Bi_{1.3}Fe_5O_{12}$ | 735° C. | 120 µm | absence | Good |
| Experimental Example 5 | $Nd_{1.1}Bi_{1.9}Fe_5O_{12}$ | 680° C. | 110 µm | absence | Good |
| Experimental Example 6 | $Nd_{1.0}Bi_{2.0}Fe_5O_{12}$ | 670° C. | 100 µm | presence | — |

The materials made of magnetic garnet single crystals in Inventive Examples 1 through 5, which were not cracked, were measured in terms of magneto-optical characteristics (Faraday rotation coefficient $\theta_F$, absorption coefficient $\alpha$, and loss at 45°) at wavelengths of 980 nm and 1017 nm. The results are shown in Table 2 (characteristics at the wavelength $\lambda$ of 980 nm) and Table 3 (characteristics at the wavelength $\lambda$ of 1017 nm). For comparison, the characteristic data of a material (Comparative Example) made of magnetic garnet single crystals formed by the LPE process which is presently used for an optical isolator for a wavelength band centered at 1310 nm, are shown in Tables 2 and 3. The Comparative Example has a composition of $Tb_{1.85}Bi_{1.15}Fe_{4.75}Al_{0.25}O_{12}$.

TABLE 2

| | $\theta_F$ (deg/cm) | $\alpha$ (dB/cm) | F (deg/dB) | loss of 45° (dB) |
|---|---|---|---|---|
| Experimental Example 1 | −2620 | 328 | 8.0 | 5.6 |
| Experimental Example 2 | −3830 | 328 | 11.7 | 3.9 |
| Experimental Example 3 | −5050 | 328 | 15.4 | 2.9 |
| Experimental Example 4 | −5770 | 328 | 17.6 | 2.6 |
| Experimental Example 5 | −7230 | 328 | 22.0 | 2.0 |
| Comparative Example | −3510 | 477 | 7.4 | 6.1 |

TABLE 3

| | $\theta_F$ (deg/cm) | $\alpha$ (dB/cm) | F (deg/dB) | loss of 45° (dB) |
|---|---|---|---|---|
| Experimental Example 1 | −2510 | 114 | 22.0 | 2.0 |
| Experimental Example 2 | −3530 | 114 | 30.9 | 1.5 |
| Experimental Example 3 | −4540 | 114 | 39.9 | 1.1 |
| Experimental Example 4 | −5160 | 114 | 45.2 | 1.0 |
| Experimental Example 5 | −6380 | 114 | 55.9 | 0.8 |
| Comparative Example | −3160 | 228 | 13.9 | 3.2 |

As is apparent from Tables 2 and 3, Experimental Examples 1 to 5 are all superior in the characteristics to Comparative Example. However, in Experimental Example 1 shown in Table 2, the loss at 45° is as large as 5.6 dB. At present, the output of a laser diode for pumping light at a wavelength of 980 nm is limited to 120 mW because an output of more than 120 mW may cause a problem in life and stability. On the other hand, the erbium doped fiber requires at least 30 mW as an input power. The difference therebetween is 6 dB, and accordingly, in consideration of a coupling loss (approximately 2 dB) of the fiber amplifier, a loss in the magnetic garnet single crystal film constituting a Faraday rotator must be 4 dB or less. Thus, Experimental Example 1 shown in Table 2 is excessively large in its loss, and is unsuitable for an optical isolator. As a result, the lower limit of the substitution ratio <x> of Bi is specified at 0.5.

The Faraday rotation coefficient is increased as the substitution ratio <x> of Bi is increased. However, as shown in Table 1, the sample (Experimental Example 6) in which the substitution ratio <x> of Bi was 2.0 was cracked. The upper limit of the substitution ratio <x> of Bi is thus specified at 1.9. As a result, Experimental Examples 2 to 5 satisfy the requirement of the present invention.

Figure 2:
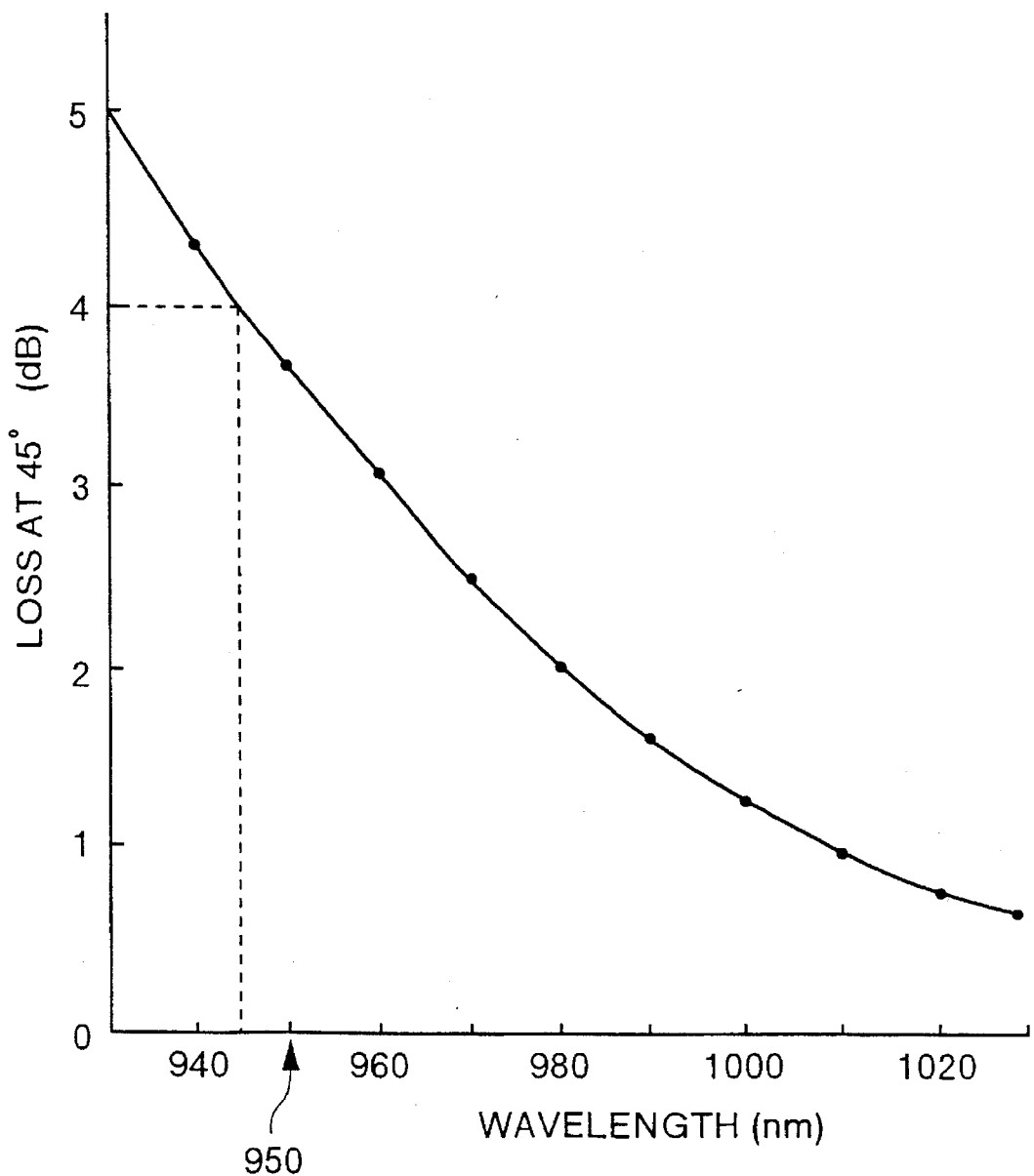
FIG. 2 is a graph showing the dependency of a loss at 45° on the wavelength with respect to a material made of magnetic garnet single crystals having a composition of $Nd_{1.1}Bi_{1.9}Fe_5O_{12}$.

FIG. 1 shows an absorption spectrum of the LPE film, wherein the solid line is for the Inventive Example and the dotted line is for the Comparative Example. From this figure, it is revealed that the absorption peak near 900 nm is shifted onto the shorter wavelength side, and that the Inventive Example has a reduced absorption coefficient compared to the Comparative Example in a wavelength band of from 900 nm to 1070 nm. In the Inventive Example, however, the absorption coefficient near 900 nm is very large. With respect to Experimental Example 5 which is most preferable in the performance among Experimental Examples 1 to 5, the dependency of a loss at 45° necessary for a Faraday rotator on the wavelength is shown in FIG. 2. As described above, assuming that the upper limit of the usable loss as an optical isolator is set at 4 dB, the lower limit of the usable wavelength becomes 950 nm. In the wavelength band larger than 1070 nm, the Inventive Example differs little from the Comparative Example in the dependency of a loss at 45° on the wavelength.

Next, the LPE film having a composition of Experimental Example 2 was grown on each non-magnetic garnet single crystal substrate in which the lattice constant was changed by varying the composition thereof. The results are shown in Table 4. The composition of the non-magnetic garnet single crystal substrate is $Gd_{3-y}Nd_ySc_2Ga_3O_{12}$. In Table 4, the term "film thickness" is indicated by that of the LPE film grown on the above substrate. As a result, it is revealed that a preferable composition can be obtained by specifying the value <y> in the range of $1.0 \leq y \leq 1.4$ and the lattice constant <a> is in the range of 12.61 Å $\leq a \leq$ 12.63 Å.

TABLE 4

| y | lattice constant <a> (Å) | film thickness (μm) | cracking | evaluation |
|---|---|---|---|---|
| 0.8 | 12.60 | 95 | large number | NG |
| 1.0 | 12.61 | 95 | small number | Good |
| 1.2 | 12.62 | 160 | absence | Good |
| 1.4 | 12.63 | 95 | small number | Good |
| 1.6 | 12.64 | 95 | large number | NG |

As described above, a material for a magneto-optical element according to one embodiment of the present invention is made of magnetic garnet single crystals expressed by a composition formula of $Nd_{3-x}Bi_xFe_5O_{12}$ ($0.5 \leq x \leq 1.9$) which is formed by the LPE Process on a non-magnetic garnet substrate having a lattice constant <a> specified in the range of 12.61 Å $\leq a \leq$ 12.63 Å, and accordingly, the material has an improved performance index particularly for a wavelength band of from 950 to 1070 nm, and it is sufficiently usable for an optical isolator for such a wavelength band. Using this material, there can be obtained an optical isolator used for a wavelength (1017 nm) for pumping light of a praseodymium doped fiber amplifier and for a wavelength (980 nm) for pumping light of an erbium doped fiber amplifier.

While the present invention has been discussed in terms of the preferred embodiments, the present invention should be implemented in various fashions with incorporating modifications of the disclosed embodiments in addition, omission or modification of the detailed construction, without departing from the principle of the invention. Therefore, the present invention should be understood to include all embodiments encompassed within the spirit of the invention set out in the appended claims.

What is claimed is:

1. A material for a magneto-optical element, said material comprising magnetic garnet single crystals expressed by a composition formula of $Nd_{3-x}Bi_xFe_5O_{12}$ wherein $0.5 \leq x \leq 1.9$ and formed by liquid-phase epitaxial growth on a non-magnetic garnet substrate, said non-magnetic garnet substrate expressed by a composition formula of $Gd_{3-y}Nd_ySc_2Ga_3O_{12}$ wherein $1.0 \leq y \leq 1.4$ and having a lattice constant a in the range of 12.61 Å $\leq a \leq$ 12.63 Å.

2. A material for a magneto-optical element according to claim 1, wherein the magneto-optical element has a design optical wavelength band in the range of 950 to 1070 nm.

* * * * *